United States Patent
Danilov et al.

(10) Patent No.: US 10,152,376 B2
(45) Date of Patent: Dec. 11, 2018

(54) DATA OBJECT RECOVERY FOR STORAGE SYSTEMS

(71) Applicant: EMC IP Holding Company LLC, Hopkinton, MA (US)

(72) Inventors: Mikhail Danilov, Saint Petersburg (RU); Konstantin Buinov, Kirovsk (RU); Andrey Fomin, Vesevolozhsk (RU); Andrey Kurilov, Saint Petersburg (RU); Maxim Trusov, Saint Petersbsurg (RU)

(73) Assignee: EMC IP HOLDING COMPANY LLC, Hopkinton, MA (US)

( * ) Notice: Subject to any disclaimer, the term of this patent is extended or adjusted under 35 U.S.C. 154(b) by 0 days.

(21) Appl. No.: 15/398,826

(22) Filed: Jan. 5, 2017

(65) Prior Publication Data

US 2018/0004600 A1   Jan. 4, 2018

(30) Foreign Application Priority Data

Jun. 29, 2016   (RU) ................................ 2016125855

(51) Int. Cl.
*H03M 13/00*    (2006.01)
*G06F 11/10*    (2006.01)
*H03M 13/37*    (2006.01)
*H03M 13/15*    (2006.01)

(52) U.S. Cl.
CPC ..... *G06F 11/1076* (2013.01); *H03M 13/3761* (2013.01); *H03M 13/1515* (2013.01)

(58) Field of Classification Search
CPC .................................................. H03M 13/154
See application file for complete search history.

(56) References Cited

U.S. PATENT DOCUMENTS

| 6,070,003 | A | * | 5/2000 | Gove ................ G06F 15/17375 |
| | | | | 710/317 |
| 6,550,035 | B1 | | 4/2003 | Okita |
| 7,549,110 | B2 | | 6/2009 | Stek et al. |
| 7,559,007 | B1 | | 7/2009 | Wilkie |
| 7,581,156 | B2 | | 8/2009 | Manasse |
| 8,458,515 | B1 | | 6/2013 | Saeed |
| 8,532,212 | B2 | * | 9/2013 | Ito ........................ H04B 7/0452 |
| | | | | 375/267 |

(Continued)

OTHER PUBLICATIONS

U.S. Non-Final Office Action dated Oct. 5, 2017 for U.S. Appl. No. 15/193,407; 14 pages.

(Continued)

*Primary Examiner* — Mujtaba M Chaudry
(74) *Attorney, Agent, or Firm* — Daly, Crowley, Mofford & Durkee, LLP

(57) ABSTRACT

A method comprising: receiving an I/O request for object data; determining one or more data fragments wherein the object data is stored; determining that one or more of the data fragments are unavailable; determining, from within the one or more unavailable data fragments, a set of slices storing the object data, each slice comprising k small data fragments and m coded fragments; for each slice, retrieving at least k small data and coded fragments within the slice from storage; and recovering a segment of the object data using the retrieved small data and coded fragments. A related system and computer program product are also described.

17 Claims, 7 Drawing Sheets

(56) References Cited

U.S. PATENT DOCUMENTS

| | | | |
|---|---|---|---|
| 8,683,296 | B2 | 3/2014 | Anderson et al. |
| 8,683,300 | B2 | 3/2014 | Stek et al. |
| 8,762,642 | B2 | 6/2014 | Bates et al. |
| 8,914,706 | B2 | 12/2014 | Anderson |
| 9,753,807 | B1 | 9/2017 | Donlan et al. |
| 9,921,910 | B2 | 3/2018 | Sangamkar et al. |
| 2005/0038968 | A1 | 2/2005 | Iwamura et al. |
| 2006/0105724 | A1* | 5/2006 | Nakao .......... H04B 7/061 455/115.1 |
| 2006/0147219 | A1* | 7/2006 | Yoshino ........ H04B 10/548 398/183 |
| 2006/0155946 | A1 | 7/2006 | Ji |
| 2008/0126357 | A1 | 5/2008 | Casanova et al. |
| 2009/0112953 | A1 | 4/2009 | Barsness et al. |
| 2010/0037056 | A1 | 2/2010 | Follis et al. |
| 2010/0091842 | A1* | 4/2010 | Ikeda .......... H04N 19/176 375/240.03 |
| 2010/0180176 | A1* | 7/2010 | Yosoku ........ H03M 13/1185 714/752 |
| 2010/0246663 | A1* | 9/2010 | Citta .......... H03M 13/00 375/240.01 |
| 2011/0029840 | A1 | 2/2011 | Ozzie et al. |
| 2011/0053639 | A1* | 3/2011 | Etienne Suanez ....... G06K 7/14 455/556.1 |
| 2011/0055494 | A1 | 3/2011 | Roberts et al. |
| 2011/0184997 | A1 | 7/2011 | Grube et al. |
| 2011/0196900 | A1 | 8/2011 | Drobychev et al. |
| 2012/0047339 | A1 | 2/2012 | Decasper et al. |
| 2012/0051208 | A1* | 3/2012 | Li .......... H04J 13/0011 370/208 |
| 2012/0060072 | A1 | 3/2012 | Simitci et al. |
| 2012/0106595 | A1* | 5/2012 | Bhattad .......... H04B 7/0421 375/146 |
| 2013/0067187 | A1 | 3/2013 | Moss et al. |
| 2013/0159603 | A1 | 6/2013 | Whitney |
| 2014/0046997 | A1 | 2/2014 | Dain et al. |
| 2014/0201541 | A1 | 7/2014 | Paul et al. |
| 2014/0380125 | A1 | 12/2014 | Calder et al. |
| 2015/0106578 | A1 | 4/2015 | Warfield et al. |
| 2016/0092109 | A1 | 3/2016 | Wu et al. |
| 2016/0239384 | A1* | 8/2016 | Slik .......... G06F 11/1076 |
| 2016/0246677 | A1 | 8/2016 | Sarigamkar et al. |
| 2017/0046127 | A1 | 2/2017 | Fletcher et al. |
| 2017/0242732 | A1 | 8/2017 | Vairavanathan et al. |
| 2017/0277915 | A1 | 9/2017 | Slik |
| 2017/0286436 | A1 | 10/2017 | Neporada et al. |

OTHER PUBLICATIONS

U.S. Non-Final Office Action dated Oct. 18, 2017 for U.S. Appl. No. 15/193,145; 21 pages.
U.S. Non-Final Office Action dated Sep. 15, 2017 for U.S. Appl. No. 15/193,409; 12 pages.
Office Action dated Nov. 27, 2017 from U.S. Appl. No. 15/186,576; 11 Pages.
Office Action dated Dec. 14, 2017 from U.S. Appl. No. 15/281,172; 9 Pages.
Response to Office Action dated Sep. 15, 2017 from U.S. Appl. No. 15/193,409, filed Dec. 14, 2017; 11 Pages.
Response to Office Action dated Oct. 5, 2017 from U.S. Appl. No. 15/193,407, filed Dec. 20, 2017; 12 Pages.
Response to Office Action dated Oct. 18, 2017 from U.S. Appl. No. 15/193,145, filed Jan. 17, 2018; 12 Pages.
Anvin, "The Mathematics of RAID-6;" First Version Jan. 20, 2004; Last Updated Dec. 20, 2011; Retrieved from https://www.kernel.org/pub/linux/kernel/people/hpa/raid6.pdf; 9 Pages.
U.S. Appl. No. 14/929,788, filed Nov. 2, 2015, Kurilov et al.
U.S. Appl. No. 15/083,324, filed Mar. 29, 2016, Danilov et al.
U.S. Appl. No. 15/193,144, filed Jun. 27, 2016, Kurilov et al.
U.S. Appl. No. 15/193,141, filed Jun. 27, 2016, Danilov et al.
U.S. Appl. No. 15/186,576, filed Jun. 20, 2016, Malygin et al.
U.S. Appl. No. 15/193,145, filed Jun. 27, 2016, Fomin et al.
U.S. Appl. No. 15/193,407, filed Jun. 27, 2016, Danilov et al.
U.S. Appl. No. 15/193,142, filed Jun. 27, 2016, Danilov et al.
U.S. Appl. No. 15/193,409, filed Jun. 27, 2016, Trusov et al.
U.S. Appl. No. 15/281,172, filed Sep. 30, 2016, Trusov et al.
U.S. Appl. No. 15/398,832, filed Jan. 5, 2017, Danilov et al.
U.S. Appl. No. 15/398,819, filed Jan. 5, 2017, Danilov et al.
Blömer et al., "An XOR-Based Erasure-Resilient Coding Scheme;" Article from CiteSeer; Oct. 1999; 19 Pages.
U.S. Appl. No. 15/620,892, filed Jun. 13, 2017, Danilov et al.
U.S. Appl. No. 15/620,897, filed Jun. 13, 2017, Danilov et al.
U.S. Appl. No. 15/620,898, filed Jun. 13, 2017, Danilov et al.
U.S. Appl. No. 15/620,900, filed Jun. 13, 2017, Danilov et al.
Response to U.S. Non-Final Office Action dated Dec. 14, 2017 for U.S. Appl. No. 15/281,172; Response Filed on Apr. 9, 2018; 12 pages.
Response to U.S. Non-Final Office Action dated Nov. 27, 2017 for U.S. Appl. No. 15/186,576; Response filed Feb. 23, 2018; 7 pages.
U.S. Final Office Action dated Mar. 1, 2018 for U.S. Appl. No. 15/193,145; 32 pages.
U.S. Final Office Action dated Mar. 2, 2018 for U.S. Appl. No. 15/193,409; 10 pages.
U.S. Non-Final Office Action dated Jun. 18, 2018 for U.S. Appl. No. 15/398,819; 8 Pages.
U.S. Notice of Allowance dated Jul. 13, 2018 for U.S. Appl. No. 15/281,172; 13 Pages.
U.S. Non-Final Office Action dated Aug. 2, 2018 for U.S. Appl. No. 15/620,897; 11 Pages.
Response to Non-Final Office Action dated Jun. 18, 2018, for U.S. Appl. No. 15/398,819; Response filed on Sep. 17, 2018; 10 Pages.

* cited by examiner

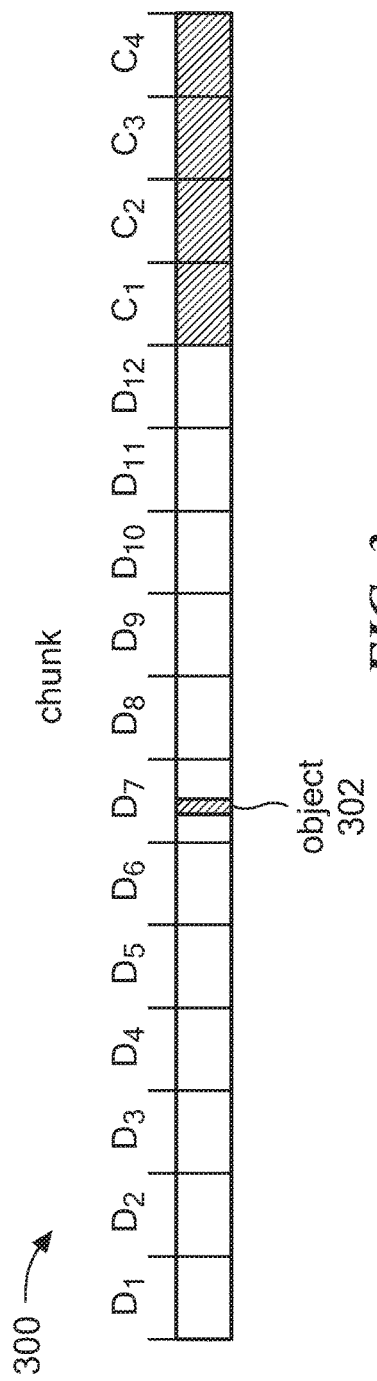
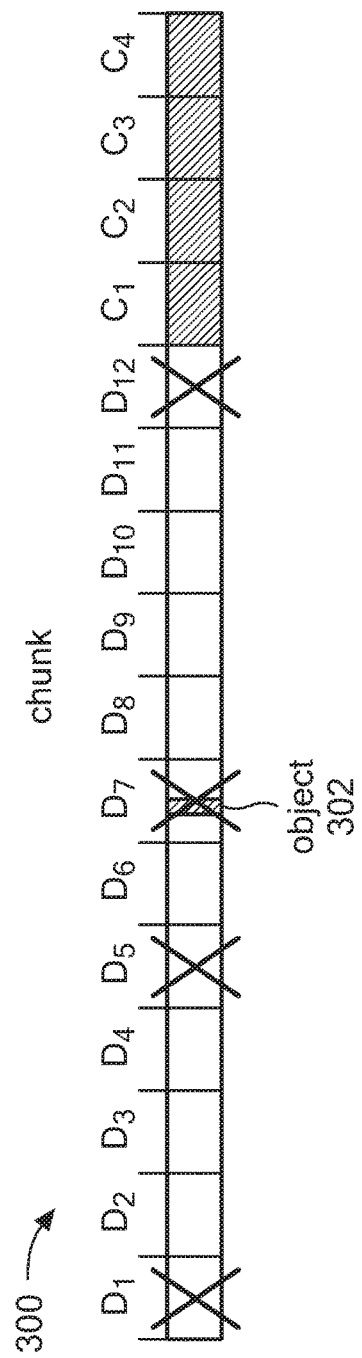

DATA OBJECT RECOVERY FOR STORAGE SYSTEMS

CROSS REFERENCE TO RELATED APPLICATIONS

This application claims priority to Russian Patent Application number 2016125855, filed Jun. 29, 2016, and entitled "DATA OBJECT RECOVERY FOR STORAGE SYSTEMS," which is incorporated herein by reference in its entirety.

BACKGROUND

Distributed storage systems may provide a wide range of storage services, while achieving high scalability, availability, and serviceability. An example of a distributed storage system is Elastic Cloud Storage (ECS) from EMC Corporation of Hopkinton, Massachusetts.

Erasure coding is a coding technique originally created as a forward error correction method for binary erasure channels. More recently, erasure coding has been used to protect data within storage systems, including distributed storage systems. If a storage node fails, data stored thereon may be recovered using coded data stored on other nodes. Existing erasure coding implementations use resource-demanding data recovery techniques that can negatively impact user I/O.

SUMMARY

Described herein are embodiments of systems and techniques to reduce the impact of data recovery on I/O. Various embodiments use pointed data recovery that can reduce I/O errors during data recovery after a hardware failure.

According to one aspect of the disclosure, a method comprises: receiving an I/O request for object data; determining one or more data fragments wherein the object data is stored; determining that one or more of the data fragments are unavailable; determining, from within the one or more unavailable data fragments, a set of slices storing the object data, each slice comprising k small data fragments and m coded fragments; for each slice, retrieving at least k small data and coded fragments within the slice from storage; and recovering a segment of the object data using the retrieved small data and coded fragments.

In some embodiment, the method further comprises determining that one or more of the data fragments is available, retrieving the one or more available data fragments, extracting a segment of the object data from the retrieved available data fragments, and generating the object data using the recovered segment of the object data and the retrieved segment of the object data. In many embodiments, recovering the segment of the object data using the retrieved small data and coded fragments comprises performing erasure decoding on each slice using the at least k small data and coded fragments within the slice. In certain embodiments, for each slice, retrieving the at least k small data and coded fragments within the slice from storage comprises retrieving at least k small data and coded fragments from two or more different nodes within a storage cluster. In particular embodiments, each of the data fragments is greater than 100 megabytes and each of the small data fragments is less than 1 kilobyte. In one embodiment, each of the small data fragments is a half-byte.

According to another aspect of the disclosure, a system comprises one or more processors; a volatile memory; and a non-volatile memory storing computer program code that when executed on the processor causes execution across the one or more processors of a process operable to perform embodiments of the method described hereinabove.

According to yet another aspect of the disclosure, a computer program product tangibly embodied in a non-transitory computer-readable medium, the computer-readable medium storing program instructions that are executable to perform embodiments of the method described hereinabove.

BRIEF DESCRIPTION OF THE DRAWINGS

The concepts, structures, and techniques sought to be protected herein may be more fully understood from the following detailed description of the drawings, in which:

FIG. 3 is a diagram of a data storage chunk, in accordance with an embodiment of the disclosure;

FIG. 3A is a diagram of a data storage chunk having unavailable data fragments, in accordance with an embodiment of the disclosure;

The drawings are not necessarily to scale, or inclusive of all elements of a system, emphasis instead generally being placed upon illustrating the concepts, structures, and techniques sought to be protected herein.

DETAILED DESCRIPTION

Before describing embodiments of the structures and techniques sought to be protected herein, some terms are explained. In certain embodiments, the term "storage system" may encompass private or public cloud computing systems for storing data as well as systems for storing data comprising virtual infrastructure and those not comprising virtual infrastructure. In some embodiments, the term "I/O request" may refer to a request to read and/or write data. In many embodiments, the terms "client" and "user" may refer to any person, system, or other entity that may send I/O requests to a storage system.

In certain embodiments, the term "storage device" may refer to any non-volatile memory (NVM) device, including hard disk drives (HDDs), flash devices (e.g., NAND flash devices), and next generation NVM devices, any of which may be accessed locally and/or remotely (e.g., via a storage attached network (SAN)). In some embodiments, the term "storage device" may also refer to a storage array comprising one or more storage devices.

Figure 1:
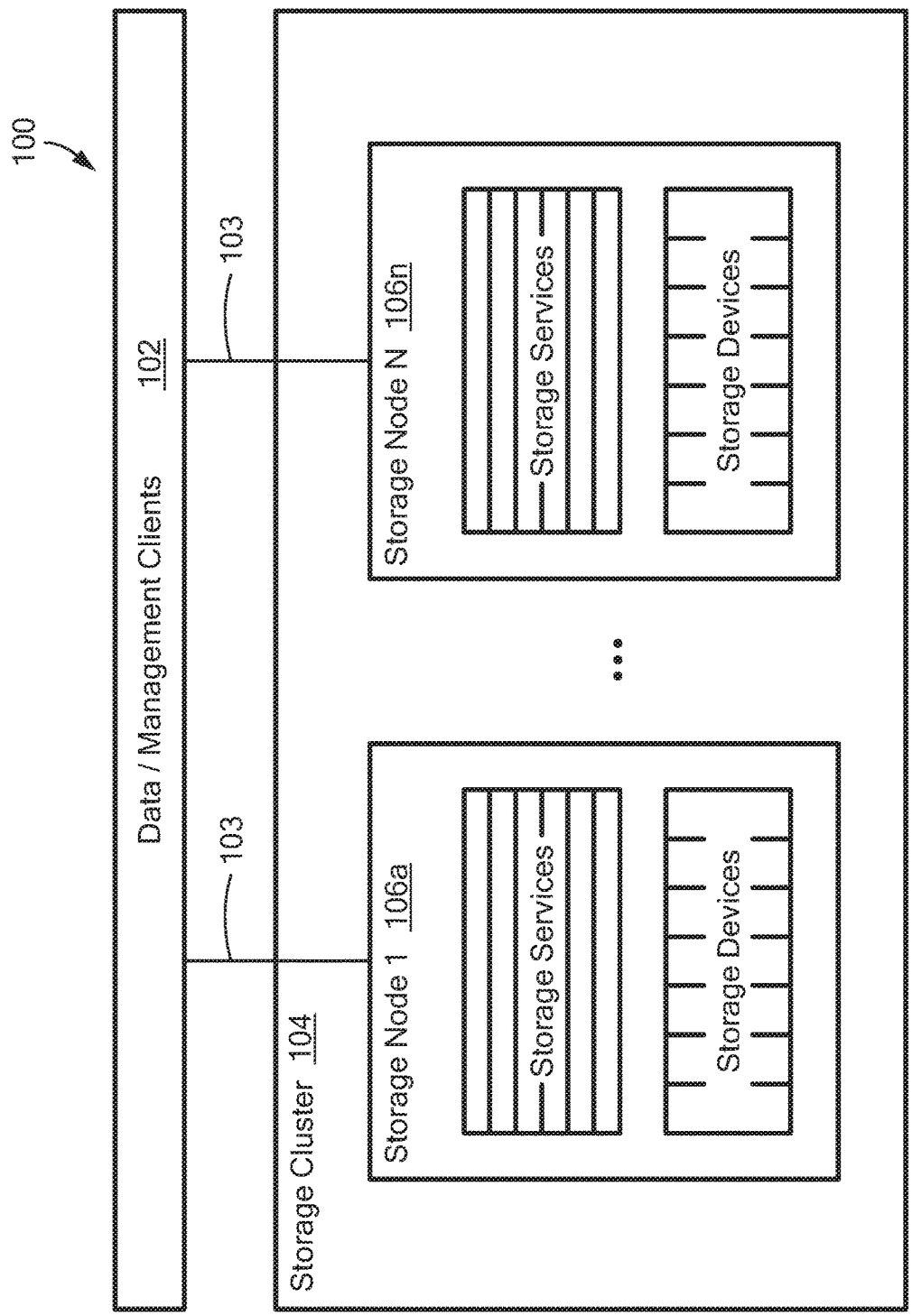
FIG. 1 is a block diagram of a storage system, in accordance with an embodiment of the disclosure.

FIG. 1 shows a storage system 100, in accordance with an embodiment of the disclosure. The storage system 100 includes one or more clients 102 in communication with a storage cluster 104 via a network 103. The storage cluster 104 includes one or more storage nodes 106a . . . 106n (generally denoted 106). In general operation, clients 102 issue requests to the storage cluster 104 to read and write data. A given request is received by any available storage node 106. The receiving node 106 processes the request locally and/or delegates request processing to one or more other nodes 106.

In some embodiments, the network may include any suitable type of communication network or combination thereof, including networks using protocols such as Ethernet, Internet Small Computer System Interface (iSCSI), Fibre Channel (FC), and/or wireless protocols. In certain embodiments, clients may include user applications, application servers, data management tools, and/or testing systems. In particular embodiments, a storage node may be the same as or similar to an embodiment shown in FIG. 1A and described below in conjunction therewith. In some embodiments, the storage cluster may utilize Elastic Cloud Storage (ECS) from EMC Corporation of Hopkinton, Massachusetts.

Figure 1A:
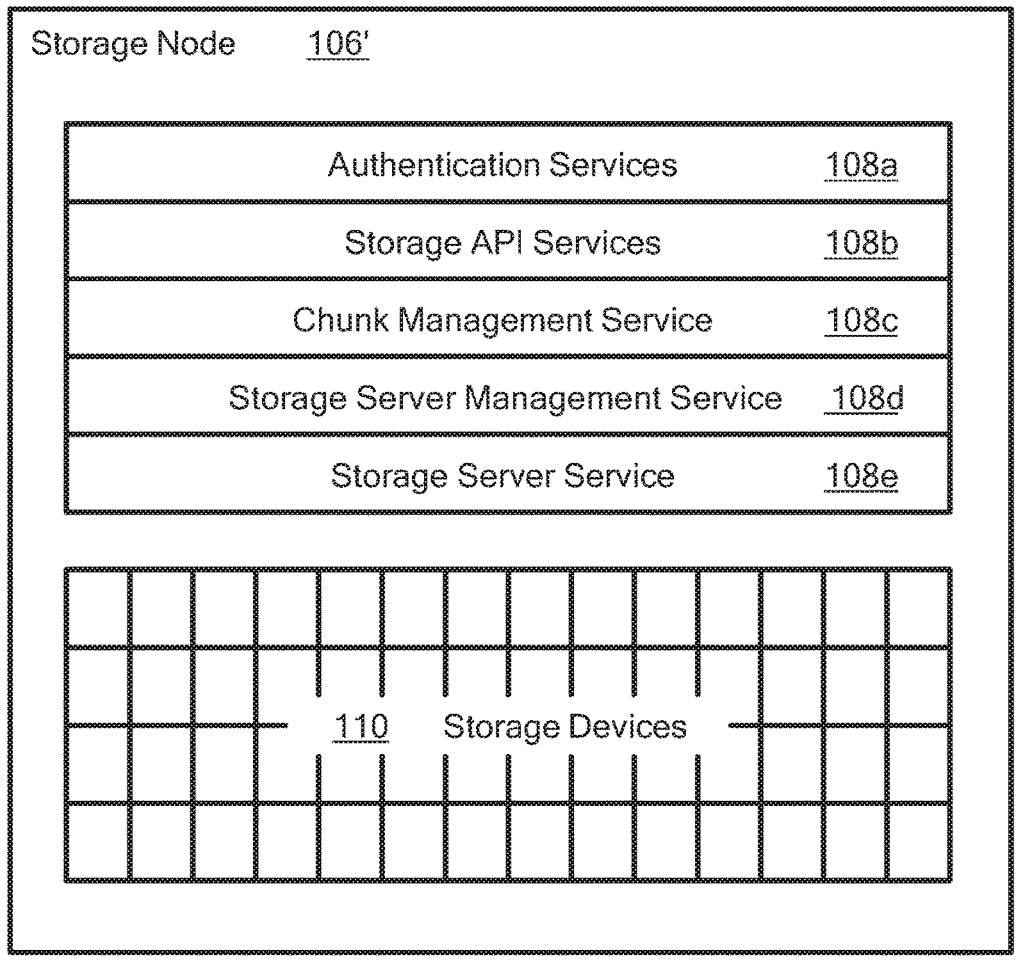
FIG. 1A is a block diagram of a storage node that may form a part of a storage system, in accordance with an embodiment of the disclosure.

FIG. 1A shows an illustrative storage node 106', in accordance with an embodiment of the disclosure. The storage node 106' includes one or more services 108 and one or more storage devices 110. The services 108 include: an authentication service 108a to authenticate requests from clients 102; storage API services 108b to parse and interpret requests from clients 102; a storage chunk management service 108c to facilitate storage chunk allocation/reclamation for different storage system needs and monitor storage chunk health and usage; a storage server management service 108d to manage available storage devices capacity and to track storage devices states; and a storage server service 108e to interface with the storage devices 110.

In one embodiment, the storage node may include a processor and a non-volatile memory storing computer program code that when executed on the processor causes the processor to execute processes operable to perform functions of the services.

In some embodiments, storage devices may comprise one or more physical and/or logical storage devices attached to the storage node. In certain embodiments, storage devices may be provided as a storage array. In particular embodiments, storage devices may be provided as VNX or Symmetrix VMAX, which are available from EMC Corporation of Hopkinton, Massachusetts.

In some embodiments, the storage devices may be partitioned into sets of fixed-sized blocks referred to as "chunks" within which user data (e.g., object data) is stored. In certain embodiments, the size of a chunk is 128 MB. A given object may be fragmented across multiple chunks, and a given chunk may store fragments of multiple different objects. In various embodiments, new data may be appended to a chunk, but existing chunk data cannot be modified. In many embodiments, when a chunk becomes full, it may be marked as "sealed." Sealed chunks are immutable.

In various embodiments, the storage node 106' may implement processing described below in conjunction with the embodiments of FIGS. 2-5 to protect against data loss. In particular embodiments, the storage chunk management service 108c may be configured to perform such processing.

Figure 2:
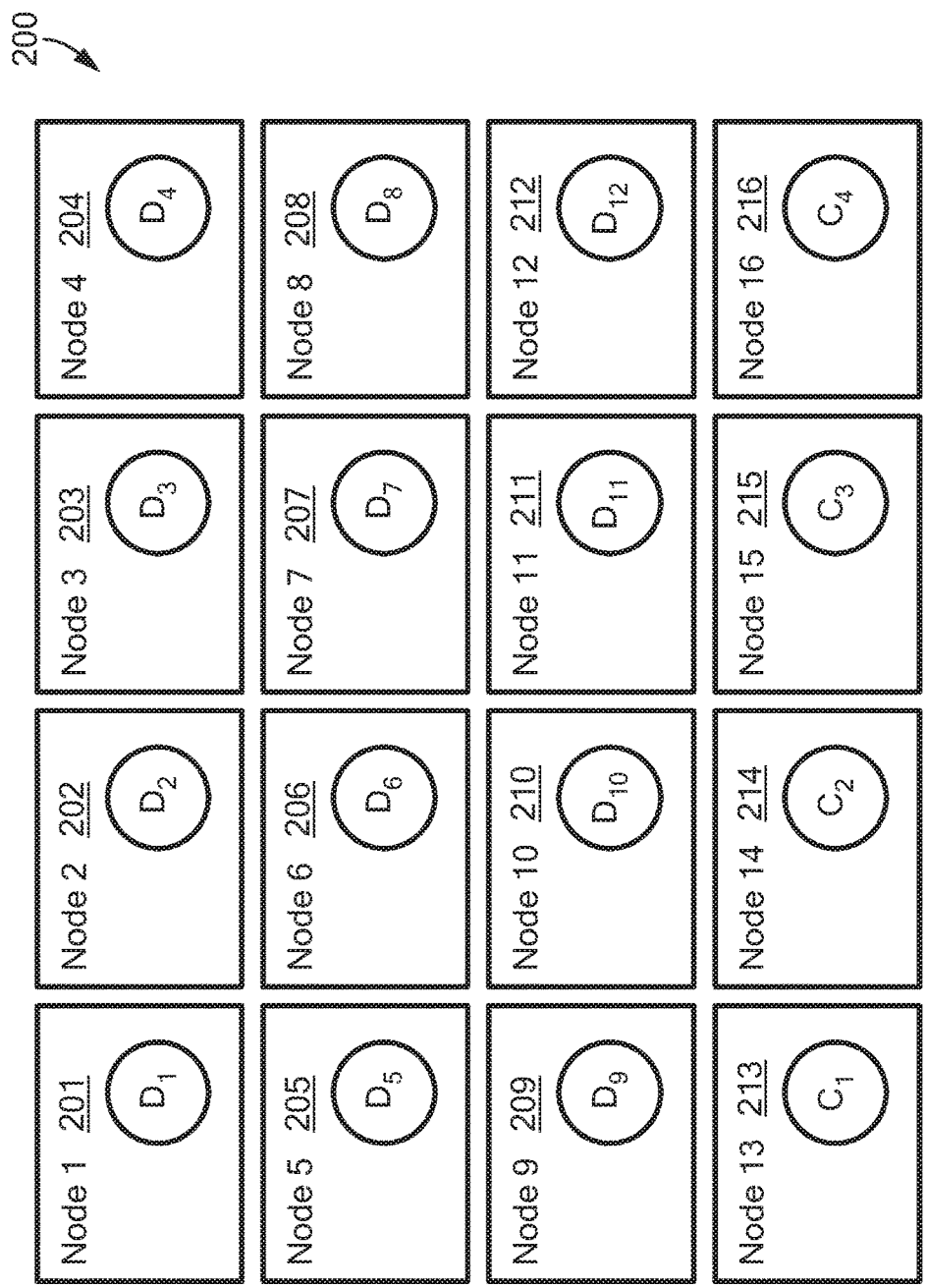
FIG. 2 is a diagram of a storage system using erasure coding to protect data, in accordance with an embodiment of the disclosure.

Referring to FIG. 2, in some embodiments, a storage system may use erasure coding to protect against data loss. In the embodiment shown, a storage system 200 performs erasure coding on chunks that have been sealed. A sealed chunk is split into k data fragments $D_1, D_2, \ldots, D_k$ and, using coding techniques described below, m coded fragments $C_1, C_2, \ldots, C_m$ are generated from the k fragments. The coded fragments C include redundant information that can be used to regenerate (or "restore") data fragments D in certain situations.

In some embodiments, the storage system may use a coding scheme that allows it to tolerate the loss of any m data fragments within a chunk. In the embodiment of FIG. 2, k=12 and m=4, although other values of k and m can be used.

In certain embodiments, a chunk may be split into k equal size data fragments $D_1, D_2, \ldots, D_k$, with padding or other data complement being added as needed to ensure the data fragments are of equal size.

Referring again to FIG. 2, the storage system 200 is a distributed storage system having a plurality of storage nodes 201-216, any of which may be the same as or similar to embodiments described above in conjunction with FIG. 1A. The data fragments $D_1, D_2, \ldots, D_k$ and coded fragments $C_1, C_2, \ldots, C_m$ are stored across multiple storage nodes 201-216. The storage system 200 includes sixteen (16) storage nodes 201-216, with each node 201-216 storing exactly one data fragment D or coded fragment C.

In other embodiments, a give storage node may store multiple data fragments and/or multiple coded fragments (e.g., if k+m is greater than the number of available nodes). In still other embodiments, some storage nodes may not store any data fragments or coded fragments (e.g., if k+m is less than the number of available nodes). In various embodiments, a storage system may include fewer than or more than sixteen (16) storage nodes.

In some embodiments, tables or other suitable data structures may be maintained to track the location of data fragments D and coded fragments C within the storage system 200. In particular embodiments, a mapping is maintained between object keys and one or more storage locations where corresponding object data is stored within the storage system 200. In certain embodiments, a first table is maintained to map object keys to chunks, and a second table is maintained to track the location of chunk data and coded fragments.

Referring again to FIG. 2, if a data fragment D is lost (e.g., due to a node failure, a storage device failure, or data corruption), the lost data fragment can be recovered using other data fragments D and coded fragments C. At least k unique fragments—either data fragments or coded fragments—within the same chunk are required to recover a lost data fragment via decoding. Thus, the storage system 200 is able to tolerate the loss of any m fragments within a given chunk.

In various embodiments, when an I/O request is received for some object data (e.g., from a client 102 in FIG. 1), the storage system 100 may determine which chunk(s) store the requested object data and where the corresponding chunk data fragments are stored (e.g., which nodes 201-216 the data fragments are stored on). Referring back to FIG. 2, the system 200 may then attempt to read one or more object segments from the chunk data fragments D. If any of the chunk data fragments are unavailable (e.g., due to a storage node failure), the system 200 may attempt to recover the unavailable data fragments (or portions thereof) using other data and coded fragments within the same chunk. This type of recover is referred to here as "on-demand recovery." In some embodiments, on-demand recover may be performed as part of the I/O request processing. In various embodiments, it is a goal to improve the efficiency of on-demand data recovery to reduce I/O request latency and to reduce the probability of I/O errors (e.g., I/O errors caused by server and/or network timeouts).

Referring back to FIG. 2, storage system 200 may perform bulk (or "batch") data recovery when a storage node 106 fails or otherwise becomes unavailable. Bulk data recover may occur in the background (i.e., separate from I/O request processing) and may be used in conjunction with on-demand data recovery (i.e., the two techniques may be complementary). In particular embodiments, the storage system 200 may maintain a list of chunks data fragments that require recovery and process the list in the background. In various embodiments, it is a goal to reduce the impact of background bulk data recovery on user I/O request processing.

In some embodiments, a matrix-based Reed-Solomon erasure coding technique may be used for data protection within a storage system. In certain embodiments, a storage chunk may be split into k data fragments $D_1, D_2, \ldots, D_k$ and the data fragments D may be arranged as a column vector ("data vector"). In some embodiments, m coded fragments $C_1, C_2, \ldots, C_m$ may be generated by multiplying an m×k matrix of coding coefficients $X_{ij}$ (referred to herein as a "coding matrix") by the k-element data vector. In some embodiments, the decoding matrix used may depend on the specific data and coded fragments that are available and/or on the specific data fragments to be recovered. In many embodiments, a second m×k matrix of coefficients $Y_{ij}$ (referred to herein as a "decoding matrix") can be used to recover unavailable data fragments, as described below. In certain embodiments, the coefficients of the coding matrix X and/or the decoding matrix Y may be selected using known erasure coding techniques and/or based upon the specific erasure coding algorithm used. In some embodiments, the coefficients of the coding matrix X and/or the decoding matrix Y may be selected such that the storage system can tolerate the loss of m data fragments within a chunk.

Referring to FIGS. 3 and 3A, in various embodiments, it may be possible to recover requested data (e.g., object data) without recovering all unavailable data fragments within a chunk. Instead, it may be sufficient to recover only those data fragments (or portions thereof) storing the requested data, thereby reducing processing and I/O costs.

FIG. 3 shows an object data 302 stored within an encoded chunk 300 (e.g., a chunk that has been encoded using erasure encoding), according to an embodiment. The encoded chunk 300 includes k data fragments $D_1, D_2, \ldots, D_k$ and m coded fragments $C_1, C_2, \ldots, C_m$, with k=12 and m=4 in this embodiment. The object data 302 may correspond to a full object or a portion thereof (sometimes referred to as an "object segment"). The object data 302 is stored in the data fragment $D_7$. In some embodiments, the size of object data may be substantially less than the size of a data fragment D. In one embodiment, the size of object data 302 may be about 10 KB whereas the size of a data fragment D may be about 10 MB.

Referring to FIG. 3A, a storage node failure can cause chunk data fragments $D_1$, $D_5$, $D_7$, and $D_{12}$ to become unavailable, according to an embodiment. If an I/O request arrives for the object data 302—which is stored in unavailable data fragment $D_7$—before bulk data recover recovers data fragment $D_7$, the I/O request triggers on-demand recovery of data fragment $D_7$ (or a portion thereof). In one embodiment, the I/O request may be a partial read that references the object data. In many embodiments, the term "partial read" refers to an I/O request to read only certain segment(s) of an object, not the entire object.

In various embodiments, unavailable data fragments D can be recovered using an erasure decoding process, wherein inputs to the process may include a decoding matrix Y, one or more coded fragments C, and one or more available data fragments.

Referring back to FIG. 3A, the unavailable data fragments $D_1$, $D_5$, $D_7$, and $D_{12}$ may be recovered using the following equations:

$$D_1 = Y_{1,1}D_2 + Y_{1,2}D_3 + Y_{1,3}D_4 Y_{1,4}D_6 + Y_{1,5}D_8 + Y_{1,6}D_9 + Y_{1,7}D_{10} + Y_{1,8}*D_{11} + Y_{1,9}C_1 + Y_{1,10}C_2 + Y_{1,11}C_3 + Y_{1,12}C_4$$

$$D_5 = Y_{2,1}D_2 + Y_{2,2}D_3 + Y_{2,3}D_4 + Y_{2,4}D_6 + Y_{2,5}D_8 + Y_{2,6}D_9 + Y_{2,7}D_{10} + Y_{2,8}D_{11} + Y_{2,9}C_1 + Y_{2,10}C_2 + Y_2 + Y_{2,11}C_3 + Y_{2,12}C_4$$

$$D_7 = Y_{3,1}D_2 + Y_{3,2}D_3 + Y_{3,3}D_4 + Y_{3,4}D_6 + Y_{3,5}D_8 + Y_{3,6}D_9 + Y_{3,7}D_{10} + Y_{3,8}D_{11} + Y_9C_1 + Y_{3,10}C_2 + Y_{3,11}C_3 + Y_{3,12}C_4$$

$$D_{12} = Y_{4,1}D_2 + Y_{4,2}D_3 + Y_{4,3}D_4 Y_{4,4}D_6 + Y_{4,5}D_8 + Y_{4,6}D_9 + Y_{4,7}D_{10} + Y_{4,8}D_{11} + Y_{4,9}C_1 + Y_{4,10}C_2 + Y_{4,11}C_3 + Y_{4,12}C_4$$

In some embodiments, decoding a full data fragment (e.g., $D_7$) requires retrieving k fragments (data or coded fragments) within the same chunk, with k=12 in the embodiment of FIG. 3A. In various embodiments, the fragments may be stored across multiple storage nodes and, thus, retrieving a fragment may incur both network and storage I/O costs. In certain embodiments, recovery of a full data fragment D may require retrieving 128 MB of data.

In various embodiments, in order reduce processing and/or I/O costs, on-demand data recovery recovers only those data fragments D within a chunk that are needed to process the I/O request. For example, referring to FIG. 3A, only data fragment $D_7$ may be restored when processing an I/O request for object segment 302.

Figure 4:
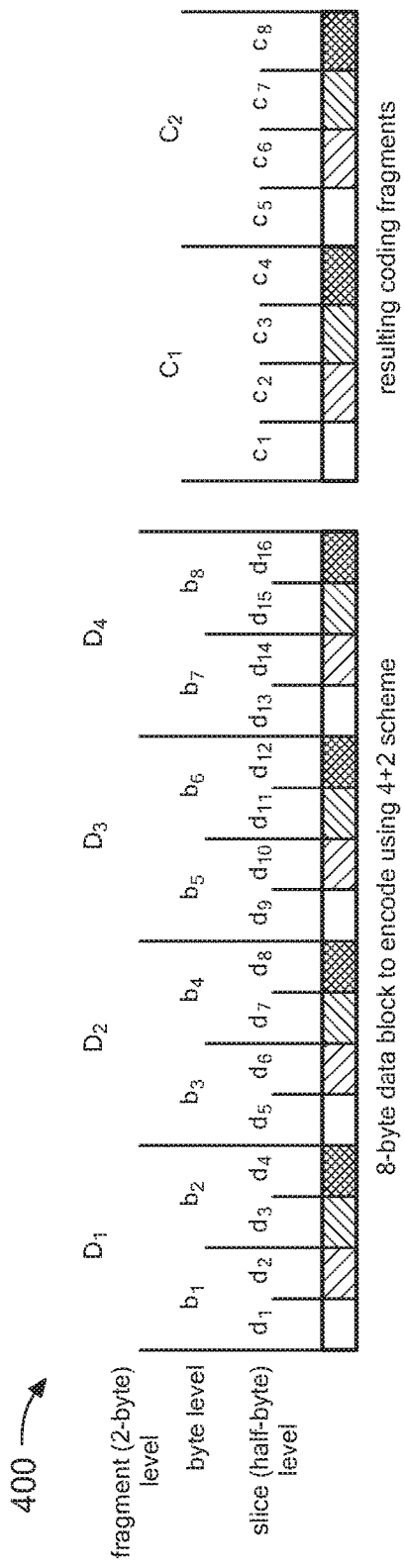
FIG. 4 is a diagram of another data storage chunk, in accordance with an embodiment of the disclosure.
Figure 4A:
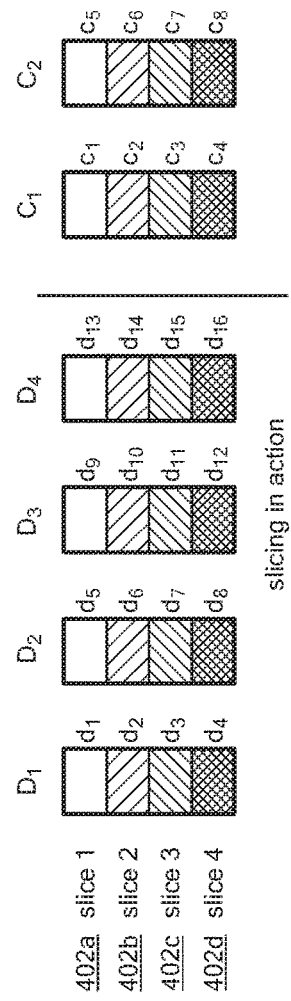
FIG. 4A is a diagram of a data storage chunk comprising a plurality of slices, in accordance with an embodiment of the disclosure.

Referring to FIGS. 4 and 4A, according some embodiments, it may be possible to recover object data without having to retrieve k full data and/or coded fragments. For example, referring to FIG. 3A, object data 302 may be recovered without fully decoding $D_7$ and, thus, without having to read the full contents of data fragments $D_2$, $D_3$, $D_4$, $D_6$, $D_8$, $D_9$, $D_{10}$, $D_{11}$ and coded fragments $C_1$, $C_2$, $C_3$, $C_4$. Instead, only a fraction of the available data fragments are read and decoded, which can decreases data recovery time resulting in faster servicing of I/O requests and a decreased probability of failed I/O requests.

In some embodiments, chunk erasure coding/decoding may be performed using units of data that are smaller than the size of a data fragment D.

Referring to FIG. 4, with k=4 and m=2, erasure coding may be performed on 8-byte chunks 400, according to an embodiment. A chunk 400 is divided into four 2-byte data fragments $D_1$, $D_2$, $D_3$, $D_4$ that can be multiplied by a coding matrix of coding coefficients $X_{ij}$ (not shown) to generate two 2-byte coded fragments $C_1$, $C_2$. Each data fragment D is split into multiple parts referred to herein as "small data fragments" and denoted $d_i$ in the figures. Each two-byte data fragment D is split into four (4) small data fragments $d_i$, each small data fragment comprising a half-byte value (or "nibble"). In particular, a first data fragment $D_1$ is split into four (4) small data fragments $d_1$, $d_2$, $d_4$, a second data fragment $D_2$ is split into four small data fragments $d_5$, $d_6$, $d_7$, $d_8$, and so on. In other embodiments, the size of the small data fragments $d_i$ may be smaller than a half-byte (e.g., 1 bit) or larger than a half-byte (e.g., several bytes).

In various embodiments, so-called "small coded fragments" $c_i$ may be generated by multiplying small data fragments $d_i$ by coding coefficients $X_{ij}$. Referring to FIG. 4, a first small coded fragment $c_1$ may be calculated as:

$$C_1 = X_{1,1}*d_1 + X_{1,2}*d_5 + X_{1,3}*d_9 + X_{1,4}*d_{13}$$

and a fifth small coded fragment $c_5$ may be calculated as:

$$C_5 = X_{2,1}*d_1 + X_{2,2}*d_5 + X_{2,3}*d_9 + X_{2,4}*d_{13}.$$

In certain embodiments, a plurality of small coded fragments can be combined to form a full coded fragment C. In the example of FIG. 4, small coded fragments $c_1$, $c_2$, $c_3$, $c_4$ may be combined to form a first coded fragment $C_1$, and small coded fragments $c_5$, $c_6$, $c_7$, $C_8$ may be combined to form a second coded fragment $C_2$.

Referring to FIG. 4A, in some embodiments, erasure coding can be implemented as a series of operations on sets of small data fragments $d_i$ and/or small coded fragments $c_i$. Each set of small data fragments, referred to herein as a "slice" 402, includes k small data fragments $d_i$ and m small coded fragments $c_i$. For example, as shown in FIG. 4A, a first slice 402a may include small data fragments $d_1$, $d_5$, $d_9$, $d_{13}$, and small coded fragments $c_1$, $c_5$.

In some embodiments, the number of slices (L) per chunk is equal to the size of a data fragment $D_i$ divided by the size of a small data fragment $d_i$. In the example shown, L=2 bytes/0.5 bytes=4. In certain embodiments, slices may be identified by a sequence number between one (1) and L.

Referring back to FIG. 4A, for a given slice 402, the small coded fragments $c_i$ within the slice can be generated using the small data fragments $d_i$ within the slice and the coding matrix X. Likewise, a small data fragment $d_i$ can be recovered using small data/coded fragments within the same slice and the decoding matrix Y. In certain embodiments, a small data fragment $d_i$ can be recovered using k unique small fragments (data or coded fragments) within the same slice.

In various embodiments, a storage system may recover object data by retrieving and decoding one or more slices. In certain embodiments, the number of slices required to be retrieved and/or decoded may depend on the amount of data to be recovered. In one embodiment, 10 KB of data can be recovered by retrieving and processing 120 KB of data within the same set of slices. In certain embodiments, the technique described herein (referred to as "slice-based recovery") may be used conditionally. In some embodiments, slice-based recovery may be used if the amount of data to be recovered is less than a threshold value: for larger object segments, it may be more efficient (e.g., in terms of I/O and/or processing) to decode full data fragments D.

In some embodiments, decoding can be accelerated using special processor instructions like VPERM for PowerPC and/or PSHUFB for Intel processors.

Figure 5:
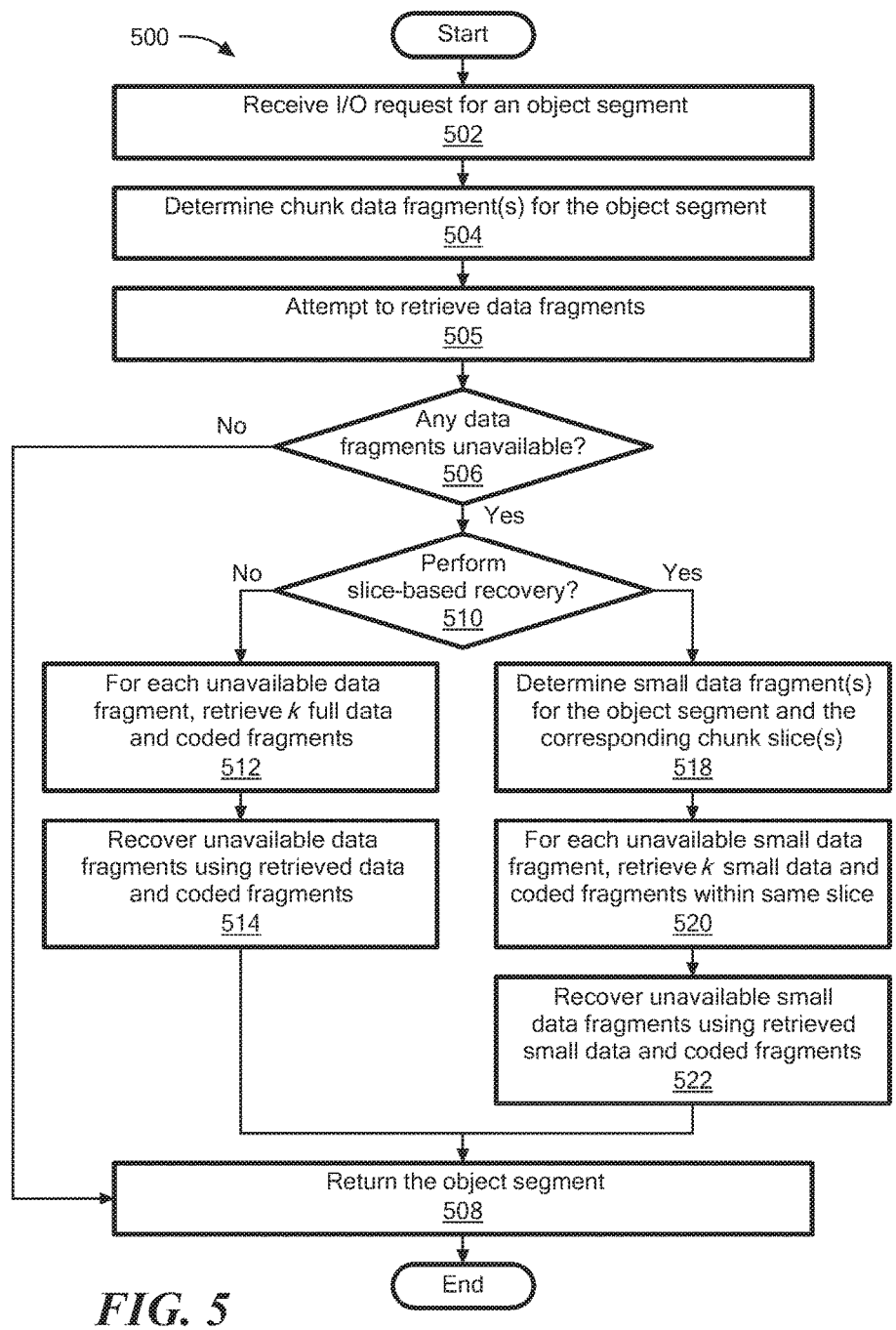
FIG. 5 is a flow diagram showing a method that may be used within the systems of FIGS. 1 and 1A, in accordance with an embodiment of the disclosure.

FIG. 5 is a flow diagram showing illustrative processing in accordance with certain embodiments of the disclosure. In some embodiments, processing may be implemented within one or more nodes 106 of storage system 100 (FIG. 1). Rectangular elements (typified by element 502) herein denoted "processing blocks," represent computer software instructions or groups of instructions. Diamond shaped elements (typified by element 506) herein denoted "decision blocks," represent computer software instructions, or groups of instructions, which affect the execution of the computer software instructions represented by the processing blocks.

Alternatively, the processing and decision blocks may represent steps performed by functionally equivalent circuits such as a digital signal processor circuit or an application specific integrated circuit (ASIC). The flow diagrams do not depict the syntax of any particular programming language. Rather, the flow diagrams illustrate the functional information one of ordinary skill in the art requires to fabricate circuits or to generate computer software to perform the processing required of the particular apparatus. It should be noted that many routine program elements, such as initialization of loops and variables and the use of temporary variables are not shown. It will be appreciated by those of ordinary skill in the art that unless otherwise indicated herein, the particular sequence of blocks described is illustrative only and can be varied without departing from the spirit of the concepts, structures, and techniques sought to be protected herein. Thus, unless otherwise stated the blocks described below are unordered meaning that, when possible, the functions represented by the blocks can be performed in any convenient or desirable order.

Referring to FIG. 5, a process 500 begins at block 502, where an I/O request is received for object data. In some embodiments, the I/O request is received from a client 102 (FIG. 1). The I/O request may include a request to read/write a full object or partial object data (e.g., a partial read).

Referring again to FIG. 5, at block 504, one or more chunk data fragments D are determined for the object data (e.g., the data fragments D that store the requested object data). In some embodiments, the object data may be stored across multiple chunks and, thus, determining the one or more chunk data fragments may include determining data fragments from two or more different chunks. In certain embodiments, the I/O request may include an object key and determining the one or more chunk data fragments may include using the object key to determine one or more storage chunks for the requested object data and, within those chunks, one or more data fragments D. In particular embodiments, the data fragments D may be stored across one or more storage nodes of a distributed storage system.

Referring again to FIG. 5, at block 505, the process 500 attempts to retrieve all the data fragments D from storage. In certain embodiments, the process may determine that one or more of the data fragments D are unavailable. For example, the process may determine that a storage node storing a data fragment D is not available and, thus, may avoid attempting to retrieve a data fragment D therefrom. In either case, if a data fragment D cannot be retrieved, it may be treated as unavailable.

Referring back to FIG. 5, at block 506, if all the data fragments D are available (e.g., the were successfully retrieved), then the object data is extracted therefrom and returned (block 508). In some embodiments, the object data may be returned to a client.

Referring again to FIG. 5, at block 506, if one or more of the data fragments D is not available (e.g., due to a failed storage node), then on-demand data recovery is performed. The process 500 supports two different types of on-demand recovery: (1) full data fragment recovery and (2) slice-based recovery. At block 510, a decision may be made as to which type of recovery to perform. In certain embodiments, this decision is based on factors described above in conjunction with FIG. 4A.

Referring again to FIG. 5, if full data fragment recovery is decided, then processing may proceed to block 512 where, for each unavailable data fragment, k unique fragments (either data fragments D or coded fragments C) within the same chunk may be retrieved from storage. In some embodiments, the specific data fragments D and coded fragments C retrieved may depend on the erasure encoding implementation, the encoding matrix X, and/or the decoding matrix Y. For example, using the equations shown above in conjunction with FIG. 3A, unavailable data fragment $D_7$ may be recovered by retrieving data fragments $D_2$, $D_3$, $D_4$, $D_6$, $D_8$, $D_9$, $D_{10}$, $D_{11}$ and coded fragments $C_1$, $C_2$, $C_3$, $C_4$.

At block 514, the unavailable data fragments D may be recovered using the retrieved data/coded fragments. In certain embodiments, recovering unavailable data fragments includes multiplying the retrieved data and coded fragments by a decoding matrix Y.

Referring back to FIG. 5, the requested object data may be extracted from the recovered data fragments D (and, possibly, from data fragments successfully retrieved at block 505) and returned (block 508).

Still referring back to FIG. 5, if slice-based data fragment recovery is decided, then processing proceeds to block 518s, where one or more small data fragments $d_i$, are determined. The small data fragments $d_i$ correspond to portions of the unavailable data fragments D where the object data is stored. Thus, the small data fragments $d_i$ determined at block 518 are referred to as "unavailable small data fragments." For each unavailable small data fragment $d_i$, a corresponding slice is also determined. It is possible that the requested object data is stored within two or more different unavailable data fragments D. In this case, the set of slices to recover may be the union of ranges calculated for each affected object segment. In certain embodiments, the process determines the minimal range of slices needed to recover the requested object data. For example, referring to FIGS. 4 and 4A, if data fragment $D_1$ is unavailable and the object data is stored within small data fragments $d_2$ and $d_3$, then slices 402b and 402c may be determined at block 518.

Referring again to FIG. 5, at block 520, for each unavailable small data fragment, k unique small fragments (either small data fragments $d_i$ or small coded fragments $c_i$) within the same slice are retrieved from storage. At block 522, the unavailable small data fragments $d_i$ are recovered using the retrieved small data and coded fragments. In certain embodiments, recovering small data fragments includes arranging the retrieved small data and coded fragments into a column vector and multiplying the column vector by a decoding matrix Y.

Referring back to FIG. 5, the requested object data is extracted from the recovered small data fragments $d_i$ (and, possibly, from data fragments successfully retrieved at block 505) and returned (block 508).

In some embodiments, both full data fragment recovery and slice-based recovery may be used when processing an I/O request. For example, in some embodiments if multiple data fragments are unavailable for a requested object data, at least one of the unavailable data fragments D may be recovered in full, whereas at least one different unavailable fragment may be partially recovered slice-based recovery.

Figure 6:
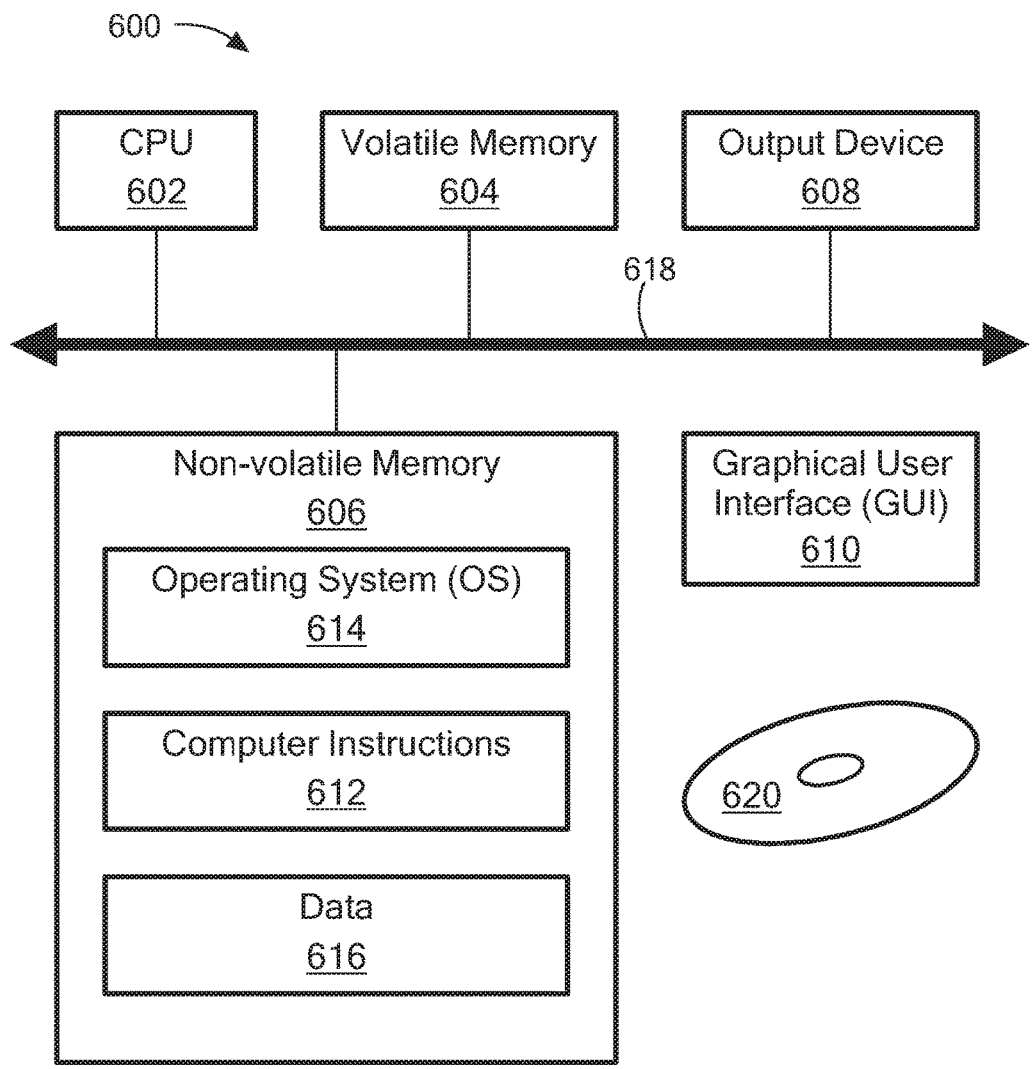
FIG. 6 is a schematic representation of a computer for use with the systems of FIGS. 1 and 1A, in accordance with an embodiment of the disclosure.

FIG. 6 shows an illustrative computer or other processing device 600 that can perform at least part of the processing described herein, in accordance with an embodiment of the disclosure. The computer 600 includes a processor 602, a volatile memory 604, a non-volatile memory 606 (e.g., hard disk), an output device 608 and a graphical user interface (GUI) 610 (e.g., a mouse, a keyboard, a display, for example), each of which is coupled together by a bus 618. The non-volatile memory 606 stores computer instructions 612, an operating system 614, and data 616. In one example, the computer instructions 612 are executed by the processor 602 out of volatile memory 604. In one embodiment, an article 620 comprises non-transitory computer-readable instructions.

Processing may be implemented in hardware, software, or a combination of the two. In various embodiments, processing is provided by computer programs executing on programmable computers/machines that each includes a processor, a storage medium or other article of manufacture that is readable by the processor (including volatile and non-volatile memory and/or storage elements), at least one input device, and one or more output devices. Program code may be applied to data entered using an input device to perform processing and to generate output information.

The system can perform processing, at least in part, via a computer program product, (e.g., in a machine-readable storage device), for execution by, or to control the operation of, data processing apparatus (e.g., a programmable processor, a computer, or multiple computers). Each such program may be implemented in a high level procedural or object-oriented programming language to communicate with a computer system. However, the programs may be implemented in assembly or machine language. The language may be a compiled or an interpreted language and it may be deployed in any form, including as a stand-alone program or as a module, component, subroutine, or other unit suitable for use in a computing environment. A computer program may be deployed to be executed on one computer or on multiple computers at one site or distributed across multiple sites and interconnected by a communication network. A computer program may be stored on a storage medium or device (e.g., CD-ROM, hard disk, or magnetic diskette) that is readable by a general or special purpose programmable computer for configuring and operating the computer when the storage medium or device is read by the computer. Processing may also be implemented as a machine-readable storage medium, configured with a computer program, where upon execution, instructions in the computer program cause the computer to operate. The program logic may be run on a physical or virtual processor. The program logic may be run across one or more a physical or virtual processors.

Processing may be performed by one or more programmable processors executing one or more computer programs to perform the functions of the system. All or part of the system may be implemented as special purpose logic circuitry (e.g., an FPGA (field programmable gate array) and/or an ASIC (application-specific integrated circuit)).

All references cited herein are hereby incorporated herein by reference in their entirety.

Having described certain embodiments, which serve to illustrate various concepts, structures, and techniques sought to be protected herein, it will be apparent to those of ordinary skill in the art that other embodiments incorporating these concepts, structures, and techniques may be used. Elements of different embodiments described hereinabove may be combined to form other embodiments not specifically set forth above and, further, elements described in the context of a single embodiment may be provided separately or in any suitable sub-combination. Accordingly, it is submitted that scope of protection sought herein should not be limited to the described embodiments but rather should be limited only by the spirit and scope of the following claims.

What is claimed is:

1. A method for retrieving data in a storage system, the method comprising:

receiving, at the storage system, an I/O request for object data, the I/O request being received from a client device;

identifying one or more data fragments where the object data is stored;

determining, by the storage system, that a first one of the data fragments is unavailable due to a failure of a node in the storage system, the first data fragment containing a plurality of first small data fragments that constitute a first portion of the object data;

retrieving, a plurality of second small data fragments and a plurality of coded fragments, the plurality of second small data fragments being generated based on the plurality of second small data fragments and a coding matrix, the plurality of second small data fragments and the plurality of coded fragments being part of a slice that is associated with the first data fragment;

recovering, by the storage system, the first portion of the object data by using the plurality of second small data fragments and the plurality of coded fragments; and completing, by the storage system, the I/O request for object data based on the recovered first portion of the object data.

2. The method of claim 1, further comprising:
determining, that a second one of the data fragments is available;
retrieving the second data fragment; and
extracting a second portion of the object data from the second data fragment,
wherein the I/O request is completed further based on the extracted second portion of the object data.

3. The method of claim 1, wherein recovering the first portion of the object data comprises performing erasure decoding on the slice.

4. The method of claim 1, wherein the plurality of second small data fragments is retrieved from two or more different nodes within the storage system.

5. The method of claim 1, wherein each of the data fragments is greater than 100 megabytes and each of the first small data fragments is less than 1 kilobyte.

6. The method of claim 5, wherein each of the first small data fragments is a half-byte.

7. A storage system comprising:
one or more processors;
a volatile memory; and
a non-volatile memory storing computer program code that when executed on the processor causes execution across the one or more processors of a process for retrieving data comprising the operations of:
receiving an I/O request for object data, the I/O request being received from a client device;
identifying one or more data fragments where the object data is stored;
determining that a first one of the data fragments is unavailable due to a failure of a node in the storage system, the first data fragment containing a plurality of first small data fragments that constitute a first portion of the object data;
retrieving a plurality of second small data fragments and a plurality of coded fragments, the plurality of second small data fragments being generated based on the plurality of second small data fragments and a coding matrix, the plurality of second small data fragments and the plurality of coded fragments being part of a slice that is associated with the first data fragment;
recovering the first portion of the object data by using the plurality of second small data fragments and the plurality of coded fragments; and
completing the I/O request for object data based on the recovered first portion of the object data.

8. The storage system of claim 7, wherein the computer program code causes execution across the one or more processors of the process further operable to perform the operations of:
determining that a second one of the data fragments is available;
retrieving the second data fragment; and
extracting a second portion of the object data from the retrieved second data fragment,
wherein the I/O request is completed further based on the extracted second portion of the object data.

9. The storage system of claim 7, wherein recovering the first portion of the object data comprises performing erasure decoding on the slice.

10. The storage system of claim 7, wherein each of the data fragments is greater than 100 megabytes and each of the first small data fragments is less than 1 kilobyte.

11. The storage system of claim 10, wherein each of the first small data fragments is a half-byte.

12. A computer program product tangibly embodied in a non-transitory computer-readable medium, the computer-readable medium storing program instructions which when executed by at least one processor that is part of a storage system cause the at least one processor to:
receive an I/O request for object data that is transmitted to the storage system by a client device;
identify one or more data fragments where the object data is stored;
determine that a first one of the data fragments is unavailable due to a failure of a node in the storage system, the first data fragment containing a plurality of first small data fragments that constitute a first portion of the object data;
retrieving, a plurality of second small data fragments and a plurality of coded fragments, the plurality of second small data fragments being generated based on the plurality of second small data fragments and a coding matrix, the plurality of second small data fragments and the plurality of coded fragments being part of a slice that is associated with the first data fragment;
recover the first portion of the object data by using the plurality of second small data fragments and the plurality of coded fragments; and
complete the I/O request for object data based on the recovered first portion of the object data.

13. The computer program product of claim 12, wherein the program instructions are further executable to:
determine that a second one of the data fragments is available;
retrieve the second data fragment; and
extract a second portion of the object data from the retrieved second data fragment,
wherein the I/O request is completed further based on the extracted second portion of the object data.

14. The computer program product of claim 12 wherein recovering the first portion of the object data comprises performing erasure decoding on the retrieved slices.

15. The computer program product of claim 12, wherein the plurality of second small data fragments is retrieved from two or more different nodes within the storage system.

16. The computer program product of claim 12, wherein each of the data fragments is greater than 100 megabytes and each of the first small data fragments is less than 1 kilobyte.

17. The computer program product of claim 16, wherein each of the first small data fragments is a half-byte.

* * * * *